US008947134B2

(12) United States Patent
Eimitsu et al.

(10) Patent No.: US 8,947,134 B2
(45) Date of Patent: Feb. 3, 2015

(54) DECOUPLING CIRCUIT AND SEMICONDUCTOR INTEGRATED CIRCUIT

(71) Applicant: Renesas Electronics Corporation, Kawasaki-shi, Kanagawa (JP)

(72) Inventors: Masatomo Eimitsu, Kanagawa (JP); Takanori Saeki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 15 days.

(21) Appl. No.: 13/786,167

(22) Filed: Mar. 5, 2013

(65) Prior Publication Data
US 2013/0181765 A1 Jul. 18, 2013

Related U.S. Application Data

(63) Continuation of application No. 13/089,253, filed on Apr. 18, 2011, now Pat. No. 8,482,323.

(30) Foreign Application Priority Data

Apr. 23, 2010 (JP) ................. 2010-099580

(51) Int. Cl.
H03B 1/00 (2006.01)
H03K 17/16 (2006.01)
H03K 19/003 (2006.01)

(52) U.S. Cl.
CPC ........ *H03K 17/162* (2013.01); *H03K 19/00384* (2013.01)
USPC .......................................... 327/112; 327/108

(58) Field of Classification Search
USPC .................................. 327/108, 112, 109, 110
See application file for complete search history.

(56) References Cited

U.S. PATENT DOCUMENTS

| 4,424,456 | A | | 1/1984 | Shiraki et al. |
| 5,506,534 | A | | 4/1996 | Guo et al. |
| 5,568,081 | A | * | 10/1996 | Lui et al. ........................ 327/380 |
| 5,914,624 | A | * | 6/1999 | Son ................................ 327/264 |

(Continued)

FOREIGN PATENT DOCUMENTS

| JP | 11-7330 A | 1/1999 |
| JP | 2003-86699 A | 3/2003 |
| JP | 2009-24602 A | 10/2009 |

OTHER PUBLICATIONS

USPTO Notice of Allowance, U.S. Appl. No. 13/089,253, Mar. 8, 2013, 8 pages.

*Primary Examiner* — Hai L Nguyen
(74) *Attorney, Agent, or Firm* — Foley & Lardner LLP

(57) ABSTRACT

A decoupling circuit includes an inverter. The inverter includes i (i is an integer of 1 or more) PMOS transistors each having a first gate electrode, and j (j is an integer of 0 or more) PMOS transistors each having a second gate electrode. The inverter includes m (m is an integer of 1 or more) NMOS transistors each having a third gate electrode, and n (n is an integer of 0 or more) NMOS transistors each having a fourth gate electrode. The first to fourth gate electrodes are coupled to an input end of the inverter. A total area of the first and second gate electrodes is different from a total area of the third and fourth gate electrodes.

9 Claims, 5 Drawing Sheets

(56) References Cited

U.S. PATENT DOCUMENTS

| | | | |
|---|---|---|---|
| 6,057,729 A | 5/2000 | Nomura | |
| 6,411,150 B1 * | 6/2002 | Williams | 327/281 |
| 6,768,363 B2 * | 7/2004 | Yoo et al. | 327/170 |
| 7,042,266 B2 | 5/2006 | Takahashi | |
| 7,719,310 B2 | 5/2010 | Yokoi et al. | |
| 7,977,981 B2 * | 7/2011 | Wilson et al. | 327/108 |
| 8,278,989 B2 * | 10/2012 | Noda | 327/270 |
| 8,482,323 B2 * | 7/2013 | Eimitsu et al. | 327/112 |

* cited by examiner

100

DECOUPLING CIRCUIT AND SEMICONDUCTOR INTEGRATED CIRCUIT

CROSS-REFERENCE TO RELATED PATENT APPLICATIONS

Japan Priority Application 2010-099580, filed Apr. 23, 2010 including the specification, drawings, claims and abstract, is incorporated herein by reference in its entirety. This application is a Continuation of U.S. application Ser. No. 13/089,253, filed Apr. 18, 2011, now U.S. Pat. No. 8,482,323, which is issued on Jul. 9, 2013, incorporated herein by reference in its entirety.

BACKGROUND OF THE INVENTION

The present invention relates to a decoupling circuit and a semiconductor integrated circuit, and more particularly to a decoupling circuit and a semiconductor integrated circuit, which can switch a capacitance value.

With an increase in the operating speed of a semiconductor integrated circuit, an on-chip decoupling capacitance for reducing a power supply noise is required. A power supply noise amount and a resonance frequency in question are determined according to a board, a package, and a chip. However, it is difficult to estimate the power supply noise amount and the resonance frequency with precision through simulation when the chip is designed. Also, in the chip that operates at plural frequencies, there is a risk that any operating frequency coincides with a resonance frequency. Hence, for the purpose of preventing the operating frequency from coinciding with the resonance frequency, the resonance frequency needs to be controlled.

An example of the above-mentioned on-chip decoupling capacitance is disclosed in Japanese Patent Laid-Open No. 2003-86699. FIG. 5 is a circuit diagram of a decoupling capacitance 300 disclosed in Japanese Patent Laid-Open No. 2003-86699. As illustrated in FIG. 5, the decoupling capacitance 300 includes an n-type MOS transistor 11 and a p-type MOS transistor 12. A source electrode of the n-type MOS transistor 11 is coupled to a ground line, a source electrode of the p-type MOS transistor 12 is coupled to a power supply line, a drain electrode of the n-type MOS transistor 11 is coupled to a gate electrode of the p-type MOS transistor 12, and a drain electrode of the p-type MOS transistor 12 is coupled to a gate electrode of the n-type MOS transistor 11.

Subsequently, the operation of the decoupling capacitance 300 will be described. The respective nodes of the gate electrodes of the n-type MOS transistor 11 and the p-type MOS transistor 12 are floating. However, the node of the gate electrode of the n-type MOS transistor is determined to a power supply line potential, and the node of the gate electrode of the p-type MOS transistor is determined to a ground line potential, by leak currents of the respective transistors in a short time after a power supply turns on. Accordingly, both of those transistors turn on, and are rendered conductive.

That is, in the decoupling capacitance 300, a series coupling of an on-resistance of the n-type MOS transistor and a gate capacitance of the p-type MOS transistor, and a series coupling of an on-resistance of the p-type MOS transistor and a gate capacitance of the n-type MOS transistor are formed between the power supply line and the ground line.

In the decoupling capacitance 300, each of the n-type MOS transistor and the p-type MOS transistor functions as both of the gate capacitance and an ESD protection resistance, and an area for newly forming an ESD protection resistance is not required. Therefore, the decoupling capacitance 300 is excellent in area efficiency.

Japanese Patent Laid-Open No. 2003-86699 discloses that the decoupling capacitance 300 can provide a decoupling capacitance that has an ESD resistance, is excellent in the area efficiency, and does not increase the number of processes.

Also, a configuration of a cross coupling type decoupling capacitor for the purpose of improving electrostatic discharge withstand voltage characteristics has been known (Japanese Patent Laid-Open No. 2009-246062). Further, there has been known a technique by which an impedance of a power supply circuit is controlled according to a waveguide frequency of the semiconductor integrated circuit (Japanese Patent Laid-Open No. 11-7330).

SUMMARY OF THE INVENTION

However, in order to control the resonance frequency of the chip, a capacitance value of the decoupling capacitance needs to be controlled. That is, the resonance frequency of the chip needs to be changed by a change in the capacitance value of the decoupling capacitance.

However, in the decoupling capacitance 300 disclosed in Japanese Patent Laid-Open No. 2003-86699, a coupling relationship between the n-type MOS transistor and the p-type MOS transistor is fixed. For that reason, the decoupling capacitance 300 has a constant capacitance value. Accordingly, the resonance frequency of the chip cannot be changed by the decoupling capacitance 300.

According to one aspect of the present invention, there is provided a decoupling circuit including a first inverter that is coupled between a first power supply and a second power supply having a voltage lower than that of the first power supply to be supplied with a power, in which the first inverter includes i (i is an integer of 1 or more) first transistors that are coupled between an output end of the first inverter and the first power supply, j (j is an integer of 0 or more) second transistors that are coupled in parallel to the first transistors and have the same conduction type as that of the first transistors, m (m is an integer of 1 or more) third transistors that are coupled between the output end of the first inverter and the second power supply and have a conduction type different from that of the first transistors, and n (n is an integer of 0 or more) fourth transistors that are coupled in parallel to the third transistors and have the same conduction type as that of the third transistors, in which control terminals of the first to fourth transistors are coupled to an input end of the first inverter, a total of gate areas of the first transistors and the second transistors is different from a total of gate areas of the third transistors and the fourth transistors. In the decoupling transistor, the first and second transistors, and the third and fourth transistors complementarily turn on and off according to a signal input to the input end. That is, a total of the gate areas of the transistors which are on changes according to the signal input to the input end. As a result, a capacitance value of the decoupling circuit changes according to the signal input to the input end.

According to another aspect of the present invention, there is provided a decoupling circuit including a first inverter that is coupled between a first power supply and a second power supply having a voltage lower than that of the first power supply to be supplied with a power, and has a capacitance value changed according to a first input signal, in which the first inverter includes i (i is an integer of 1 or more) first transistors that are coupled between an output end of the first inverter and the first power supply, j (j is an integer of 0 or more) second transistors that are coupled in parallel to the first transistors, m (m is an integer of 1 or more) third transistors that are coupled between the output end of the first inverter and the second power supply, and n (n is an integer of 0 or more) fourth transistors that is coupled in parallel to the third transistors, in which the first and second transistors, and the third and fourth transistors complementarily turn on and off according to the first input signal, a total of gate areas of the first transistors and the second transistors is different from a total of gate areas of the third transistors and the fourth transistors. In the decoupling transistor, the first transistor and the second transistor complementarily turn on and off according to the first input signal. That is, a total of the gate areas of the transistors which are on changes according to the first input signal. As a result, a capacitance value of the decoupling circuit changes according to the first input signal.

According to the present invention, the decoupling circuit that can switch the capacitance value can be provided.

DETAILED DESCRIPTION OF THE PREFERRED EMBODIMENTS

First Embodiment

Figure 1:
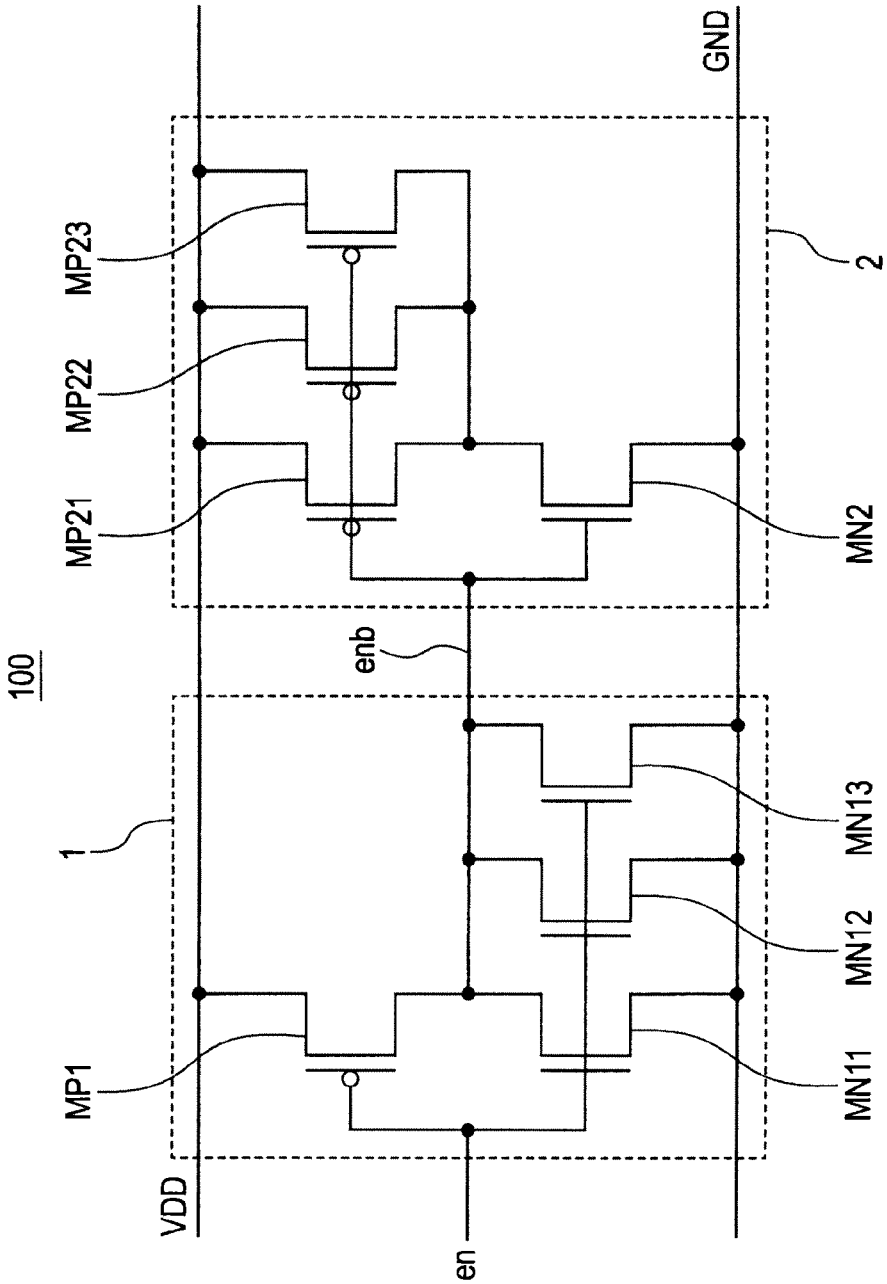
FIG. 1 is a circuit diagram of a decoupling circuit according to a first embodiment.

Hereinafter, embodiments of the present invention will be described with reference to the accompanying drawings. FIG. 1 is a circuit diagram of a decoupling circuit 100 according to a first embodiment. As illustrated in FIG. 1, the decoupling circuit 100 includes an inverter 1 and an inverter 2. An enable signal en is input to an input end of the inverter 1. An output end of the inverter 1 is coupled to an input end of the inverter 2. Also, the inverter 1 and the inverter 2 are coupled between a supply voltage VDD and a ground voltage GND so as to be applied with a power.

The inverter 1 has a PMOS transistor MP1 and NMOS transistors MN11 to MN13 coupled in series. Specifically, a source of the PMOS transistor MP1 is coupled to the supply voltage VDD. A drain of the PMOS transistor MP1 is coupled to drains of the NMOS transistors MN11 to MN 13. A coupling point of the drain of the PMOS transistor MP1 and the drains of the NMOS transistors MN11 to MN13 is coupled to the output end of the inverter 1. Sources of the NMOS transistors MN11 to MN13 are coupled to the ground voltage GND. Gates of the PMOS transistor MP1 and the NMOS transistors MN11 to MN13 are coupled to the input end of the inverter 1, and receive the enable signal en.

In this example, the PMOS transistor MP1 and the NMOS transistors MN11 to MN13 are MOS transistors having the same size. That is, since the PMOS transistor MP1 and the NMOS transistors MN11 to MN13 have the same gate width and gate length, the gate areas of the respective MOS transistors are identical with each other. Accordingly, a total gate area of the NMOS transistors is three times as large as the gate area of the PMOS transistor in the inverter 1. That is, a total gate area of the NMOS transistors is larger than the gate area of the PMOS transistor in the inverter 1.

The inverter 2 has PMOS transistors MP21 to MP23 and an NMOS transistor MN2 coupled in series. Specifically, sources of the PMOS transistors MP21 to MP23 are coupled to the supply voltage VDD. Drains of the PMOS transistors MP21 to MP23 are coupled to a drain of the NMOS transistor MN2. A coupling point of the drains of the PMOS transistors MP21 to MP23 and the drain of the NMOS transistor MN2 is coupled to an output end of the inverter 2. A source of the NMOS transistor MN2 is coupled to the ground voltage GND. Gates of the PMOS transistors MP21 to MP23 and the NMOS transistor MN2 are coupled to the input end of the inverter 2. Also, the input end of the inverter 2 is coupled to the output end of the inverter 1. Accordingly, the gates of the PMOS transistors MP21 to MP23 and the NMOS transistor MN2 receive an inverted enable signal enb which is an inverted signal of the enable signal en.

In this example, the PMOS transistors MP21 to MP23 and the NMOS transistor MN2 are MOS transistors having the same size. That is, since the PMOS transistors MP21 to MP23 and the NMOS transistor MN2 have the same gate width and gate length, the gate areas of the respective MOS transistors are identical with each other. Accordingly, a total gate area of the PMOS transistors is three times as large as the gate area of the NMOS transistor in the inverter 2. That is, a total gate area of the PMOS transistors is larger than the gate area of the NMOS transistor in the inverter 2.

Figure 2:
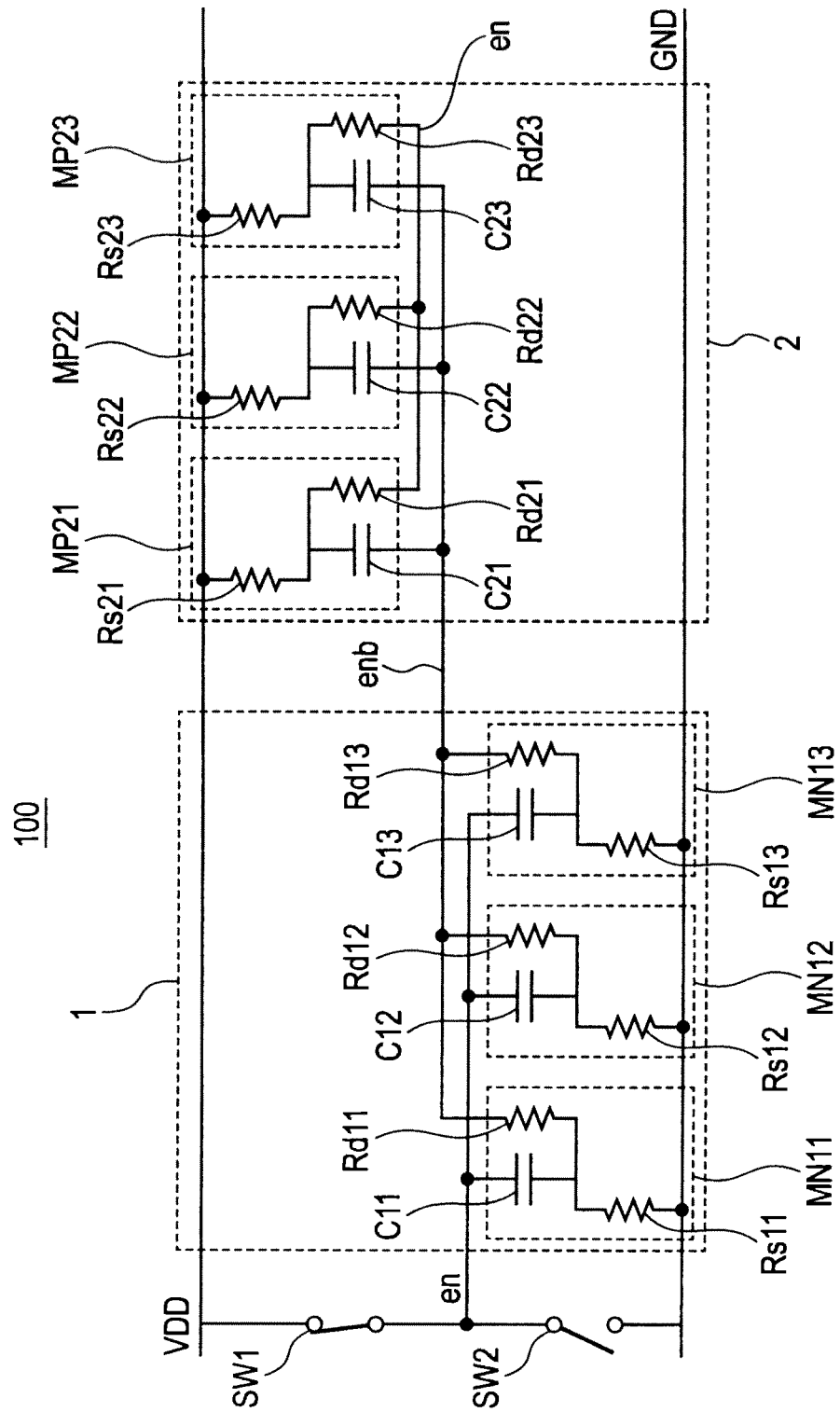
FIG. 2 is a diagram illustrating an equivalent circuit of the decoupling circuit when an enable signal en is "1"

Subsequently, the operation of the decoupling circuit 100 will be described. First, a case in which the enable signal en is will be described. FIG. 2 is a diagram illustrating an equivalent circuit of the decoupling circuit 100 when the enable signal en is "1". In FIG. 2, the gate capacitances (MOS capacitances) of the MOS transistors that are on are represented by capacitors. Resistances in diffusion regions formed in the sources and drains of the MOS transistors that are on are represented by resistors.

As illustrated in FIG. 2, when a switch SW1 is on, and a switch SW2 is off, the enable signal en becomes "1". As a result, in the inverter 1, the PMOS transistor MP1 turns off, and the NMOS transistors MN11 to MN13 turn on. Hence, the NMOS transistor MN11 is represented by a drain resistance Rd11, a source resistance Rs11, and a gate capacitance C11. The drain resistance Rd11 and the source resistance Rs11 are coupled in series between the output end of the inverter 1 (a node of inverted enable signal enb level) and the ground voltage GND. The gate capacitance C11 is coupled between the input end of the inverter 1 (a node of enable signal en level) and a coupling point between the drain resistance Rd11 and the source resistance Rs11. Likewise, the NMOS transistor MN12 is represented by a drain resistance Rd12, a source resistance Rs12, and a gate capacitance C12. The NMOS transistor MN13 is represented by a drain resistance Rd13, a source resistance Rs13, and a gate capacitance C13.

Also, since the inverted enable signal enb becomes "0", in the inverter 2, the PMOS transistors MP21 to MP23 turn on, and the NMOS transistor MN2 turns off. Hence, the PMOS transistor MP21 is represented by a drain resistance Rd21, a source resistance Rs21, and a gate capacitance C21. The drain resistance Rd21 and the source resistance Rs21 are coupled in series between the output end of the inverter 2 (a node of enable signal en level) and the supply voltage VDD. The gate capacitance C21 is coupled between the output end of the inverter 1 (a node of inverted enable signal enb level), and a coupling point between the drain resistance Rd21 and the source resistance Rs21. Likewise, the PMOS transistor MP22 is represented by a drain resistance Rd22, a source resistance Rs22, and a gate capacitance C22. The PMOS transistor MP23 is represented by a drain resistance Rd23, a source resistance Rs23, and a gate capacitance C23.

Figure 3:
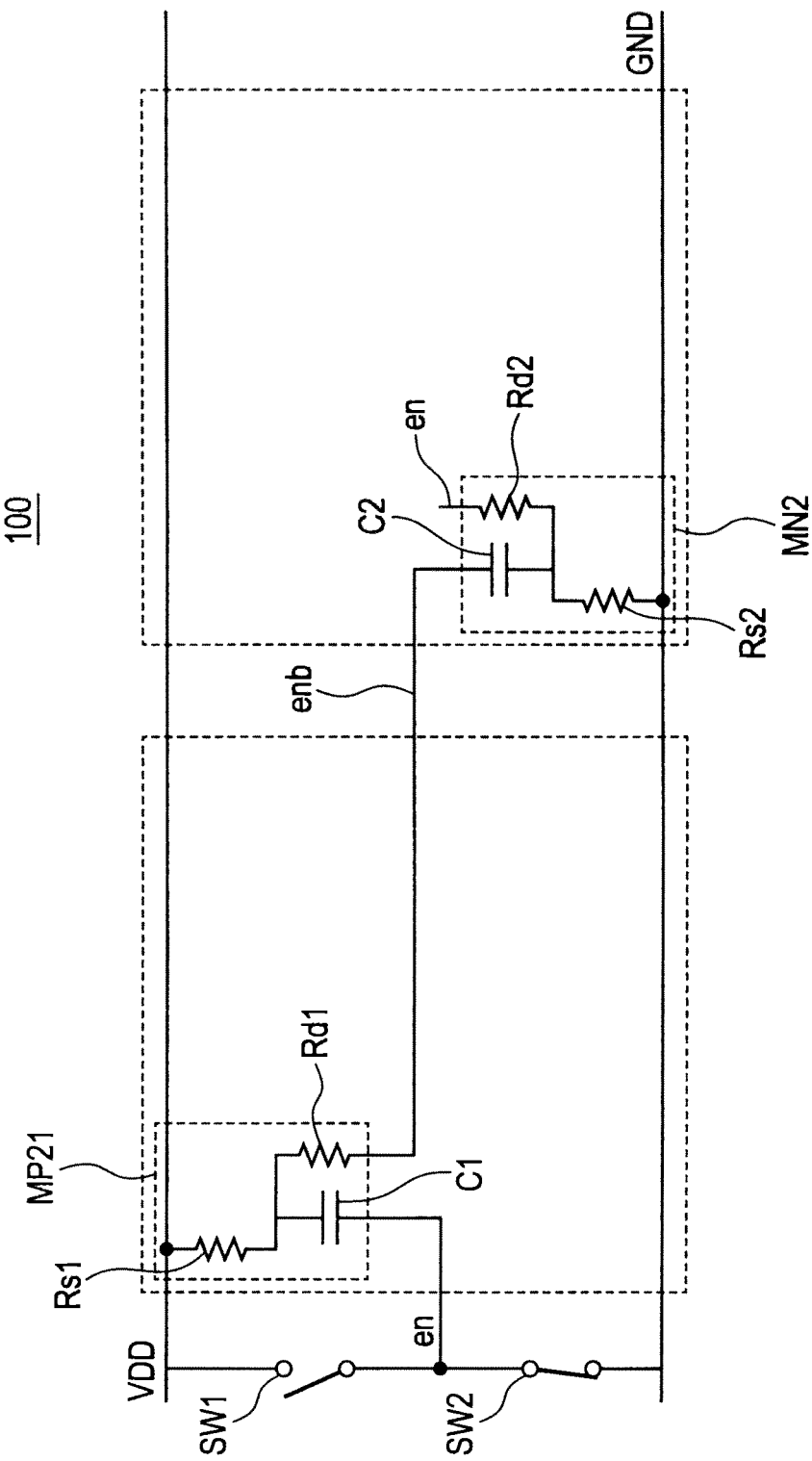
FIG. 3 is a diagram illustrating an equivalent circuit of the decoupling circuit when an enable signal en is "0"

Subsequently, a case in which the enable signal en is "0" will be described. FIG. 3 is a diagram illustrating an equivalent circuit of the decoupling circuit 100 when the enable signal en is "0". In FIG. 3, like FIG. 2, the gate capacitances (MOS capacitances) of the MOS transistors that are on are represented by capacitors. Resistances in diffusion regions formed in the sources and drains are represented by resistors.

As illustrated in FIG. 3, when a switch SW1 is off, and a switch SW2 is on, the enable signal en becomes "0". As a result, in the inverter 1, the PMOS transistor MP1 turns on, and the NMOS transistors MN11 to MN13 turn off. Hence, the PMOS transistor MP1 is represented by a drain resistance Rd1, a source resistance Rs1, and a gate capacitance C1. The drain resistance Rd1 and the source resistance Rs1 are coupled in series between the output enb of the inverter 1 (a node of inverted enable signal end level) and the supply voltage VDD. The gate capacitance C1 is coupled between the input end of the inverter 1 (a node of enable signal en level) and a coupling point between the drain resistance Rd1 and the source resistance Rs1.

Also, since the inverted enable signal enb becomes "1", in the inverter 2, the PMOS transistors MP21 to MP23 turn off, and the NMOS transistor MN2 turns on. Hence, the NMOS transistor MN2 is represented by a drain resistance Rd2, a source resistance Rs2, and a gate capacitance C2. The drain resistance Rd2 and the source resistance Rs2 are coupled in series between the output end of the inverter 1 (a node of inverted enable signal enb level) and the ground voltage GND. The gate capacitance C2 is coupled between the output end of the inverter 1 (a node of enable signal en level), and a coupling point between the drain resistance Rd2 and the source resistance Rs2.

That is, the decoupling circuit 100 functions as the decoupling capacitance regardless of the enable signal en. Further, in the decoupling circuit 100, the capacitance value when the enable signal en is "1" is three times as large as the capacitance value when the enable signal en is "0". That is, according to this configuration, there can be provided the decoupling circuit that can switch the capacitance value inserted between the supply voltage VDD and the ground voltage according to switching of the enable signal en. Accordingly, when the decoupling circuit 100 is mounted on the semiconductor integrated circuit, the resonance frequency of the semiconductor integrated circuit can be changed.

In the inverter 1 and the inverter 2 in the decoupling circuit 100, the gate area of one of the transistors coupled in series is larger than the gate area of the other transistor. Accordingly, as compared with the configuration of the related art, a synthetic resistance value inserted in the supply voltage VDD and the ground voltage can be reduced. Therefore, according to this configuration, there can be provided the decoupling circuit advantageous in the high-speed operation.

All of the PMOS transistors and the NMOS transistors provided in the inverter 1 and the inverter 2 which configure the decoupling circuit 100 function as the decoupling capacitance. Accordingly, with only provision of the minimum numbers of PMOS transistors and NMOS transistors, a desired decoupling capacitance can be obtained. Therefore, according to this configuration, the decoupling circuit excellent in the area efficiency can be provided.

Further, the decoupling circuit 100 can easily switch the capacitance value by only a single enable signal en.

Furthermore, in the decoupling circuit 100, since the inverter 1 and the inverter 2 are symmetrically configured, the PMOS transistors and the NMOS transistors can be arranged with a proper balance. Therefore, with application of the decoupling circuit 100, the semiconductor integrated circuit excellent in the area efficiency can be realized.

Second Embodiment

Figure 4:
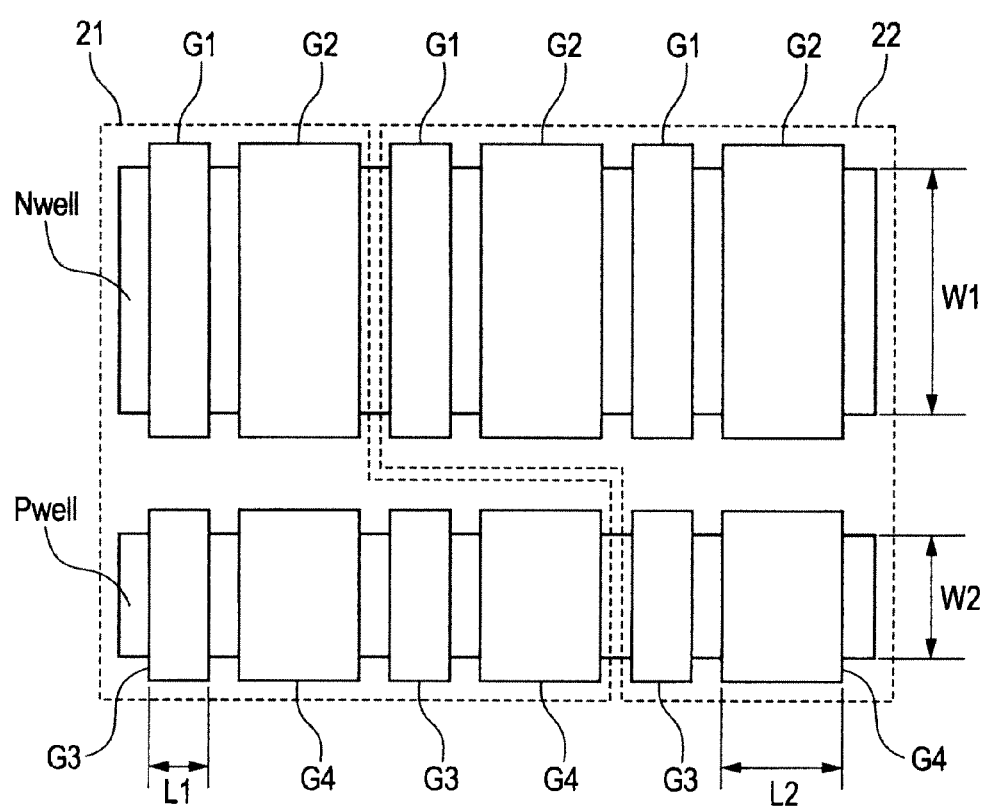
FIG. 4 is a configuration diagram schematically illustrating a layout of MOS transistors in a decoupling circuit according to a second embodiment.
Figure 5:
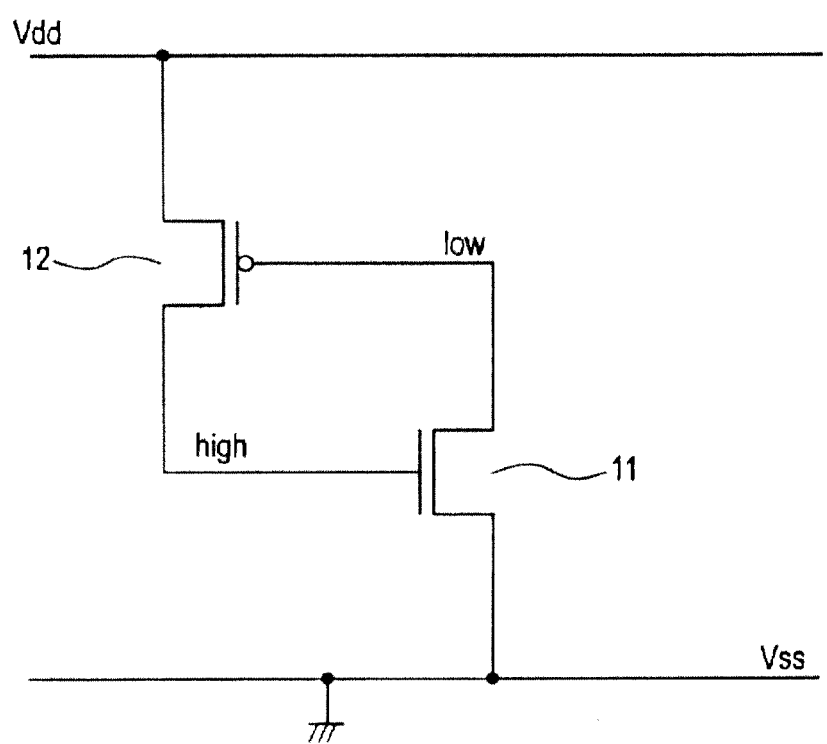
FIG. 5 is a circuit diagram of a decoupling circuit disclosed in Japanese Patent Laid-Open No. 2003-86699.

Subsequently, a decoupling circuit 200 according to a second embodiment will be described. FIG. 4 is a configuration diagram schematically illustrating a layout of MOS transistors in a decoupling circuit 200 according to a second embodiment. As illustrated in FIG. 4, the decoupling circuit 200 is configured by an inverter 21 and an inverter 22. In the inverter 21 and the inverter 22 are formed an n-well region Novell and a p-well region Pwell. Above the n-well regions Nwell of the inverter 21 and the inverter 22 are formed gate electrodes G1 and G2. Above the p-well regions Pwell of the inverter 21 and the inverter 22 are formed gate electrodes G3 and G4. That is, a portion where the gate electrode G1 or G2 is formed above the n-well region Nwell configures the PMOS transistor. A portion where the gate electrode G3 or G4 is formed above the p-well region Pwell configures the NMOS transistor.

Hence, in the inverter 21 are formed two PMOS transistors and four NMOS transistors. In the inverter 22 are formed four PMOS transistors and two NMOS transistors.

Further, the respective gate electrodes G1 to G4 are different in dimensions from each other. Gate widths of the gate electrodes G1 and G2 formed on the n-well region Nwell are equal to each other, and W1. Gate widths of the gate electrodes G3 and G4 formed on the p-well region Pwell are equal to each other, and W2. Also, gate lengths of the gate electrodes G1 and G3 are equal to each other, and L1. Gate lengths of the gate electrodes G2 and G4 are equal to each other, and L2. In FIG. 4, L2<L2. Also, W1>W2.

That is, in the inverters 21 and 22 are formed two kinds of PMOS transistors which are equal in the gate width but different in the channel length. Likewise, in the inverters 21 and 22 are formed two kinds of NMOS transistors which are equal in the gate width but different in the channel length.

Although not shown, the enable signal en is input to the respective gate electrodes of the inverter 21. The inverted enable signal enb is input to the respective gate electrodes of the inverter 22. Accordingly, the decoupling circuit 200 can conduct the same operation as that of the decoupling circuit 100.

As described above, in the decoupling circuit 200 are formed the MOS transistors having the plural gate lengths. Hence, in the decoupling circuit 200 are formed the MOS transistors different in the resistance value.

If the resistance value of the MOS transistor is different, the frequency characteristic as the decoupling capacitance is also different. That is, in the decoupling circuit 200 are formed the MOS transistors having the plural different frequency characteristics. Therefore, the decoupling circuit 200 can deal with the plural frequency characteristics.

Other Embodiments

The present invention is not limited to the above embodiments, but can be appropriately changed without departing from the subject matter. For example, in the above-mentioned embodiments, two inverters are used. However, the decoupling circuit can be configured by using only any inverter. Further, the decoupling circuit can be configured by using three or more inverters.

In the decoupling circuit 100, a ratio of the PMOS transistors and the NMOS transistors in the inverter 1 and the inverter 2 is 1:3, but can be arbitrarily set, for example, 1:100. Likewise, in the decoupling circuit 200, a ratio of the PMOS transistors and the NMOS transistors in the inverter 21 and the inverter 22 can be arbitrarily set.

The PMOS transistors and the NMOS transistors in the inverters of the decoupling circuit 100 needs to be different from each other in a total of the gate areas. That is, one of the total of the gate areas of the PMOS transistors and the total of the gate areas of the NMOS transistors needs to be larger than the other total. The same is applied to the decoupling circuit 200.

The output end of the inverter 2 may not be always coupled to the input end of the inverter 1. For example, an inverted enable signal enb can be input to the input end of the inverter 2, separately.

In the inverter 1, the total of the gate areas of the PMOS transistors is different from the total of the gate areas of the NMOS transistors. Accordingly, when the respective gate areas of the PMOS transistors and the NMOS transistors are equal to each other, the number of PMOS transistors can be different from the number of NMOS transistors. When the respective numbers of PMOS transistors and NMOS transistors are equal to each other, the gate area of the PMOS transistors can be different from the gate area of the NMOS transistors. That is, the gate width of the PMOS transistors can be different from the gate width of the NMOS transistors. Alternatively, the gate length of the PMOS transistors can be different from the gate length of the NMOS transistors. Further, the gate width and gate length of the PMOS transistors can be different from the gate width and gate length of the NMOS transistors, respectively. The gates areas of the respective PMOS transistors do not need to be equal to each other. The gates areas of the respective NMOS transistors do not need to be equal to each other. The same is applied to the inverter 2.

In the decoupling circuit 100, the inverter 1 and the inverter 2 are symmetrically configured. That is, the total of the gate areas of the PMOS transistors in the inverter 1 is equal to the total of the gate areas of the NMOS transistors in the inverter 2. The total of the gate areas of the NMOS transistors in the inverter 1 is equal to the total of the gate areas of the PMOS transistors in the inverter 2. That is, the PMOS transistors in the inverter 1 and the NMOS transistors in the inverter 2 need to be equal to each other in the number and the gate area. Also, the NMOS transistors in the inverter 1 and the PMOS transistors in the inverter 2 need to be equal to each other in the number and the gate area. In this case, the PMOS transistors in the inverter 1 and the NMOS transistors in the inverter 2 need to be equal to each other in the gate width and the gate length. The NMOS transistors in the inverter 1 and the PMOS transistors in the inverter 2 need to be equal to each other in the gate width and the gate length. The configuration of the decoupling circuit is not limited to the symmetrical configuration as with the decoupling circuit 100.

It is needless to say that the decoupling circuit according to the above embodiments can be incorporated into a semiconductor integrated circuit for use.

What is claimed is:

1. A circuit comprising:
   a first power supply line;
   a second power supply line;
   a first transistor coupled between the first and second power supply lines and having a first conductivity type;
   a second transistor coupled between the first and second power supply lines, coupled in series with the first transistor via a first node, and having a second conductivity type different from the first conductivity type,
   a third transistor coupled in parallel with the second transistor between the first node and the second power supply line, and having the second conductivity type, the second transistor and the third transistor coupled directly to the second power supply line and coupled directly to the first transistor, wherein gate terminals of the second and third transistors are coupled in common;
   a fourth transistor coupled between the first and second power supply lines and having the first conductivity type;
   a fifth transistor coupled between the first and second power supply lines, coupled in series with the fourth transistor via a second node, and having the second conductivity type, gate terminals of the fourth and fifth transistors being coupled in common with the first node; and
   a sixth transistor coupled in parallel with the fourth transistor between the second node and the first power supply line, and having the first conductivity type, wherein gate terminals of the fourth and sixth transistors are coupled in common, the fourth transistor and the sixth transistor coupled directly to the fifth transistor.

2. The circuit according to claim 1, further comprising:
   a seventh transistor coupled in parallel with the second and third transistors between the first node and the second power supply line, and having the second conductivity type.

3. The circuit according to claim 1, further comprising:
   a eighth transistor coupled in parallel with the fourth and sixth transistors between the second node and the first power supply line, and having the first conductivity type.

4. The circuit according to claim 1, wherein each of the first to sixth transistors is a MOS transistor.

5. The circuit according to claim 1, wherein gate terminals of the first and second transistors are coupled in common.

6. The circuit according to claim 5, wherein an enable signal is inputted to the gate terminals of the first and the second transistors.

7. The circuit according to claim 1, wherein fourth transistor and the sixth transistor are coupled directly to the first power supply line.

8. The circuit according to claim 1, wherein first transistor is coupled directly to the first power supply line.

9. The circuit according to claim 1, wherein fifth transistor is coupled directly to the second power supply line.

* * * * *